(12) United States Patent
Byun

(10) Patent No.: US 10,990,541 B2
(45) Date of Patent: Apr. 27, 2021

(54) CONTROLLER USING CACHE EVICTION POLICY BASED ON READ DATA SIZE

(71) Applicant: SK hynix Inc., Gyeonggi-do (KR)

(72) Inventor: Eu Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/522,344

(22) Filed: Jul. 25, 2019

(65) Prior Publication Data

US 2020/0210348 A1 Jul. 2, 2020

(30) Foreign Application Priority Data

Dec. 28, 2018 (KR) .................. 10-2018-0172800

(51) Int. Cl.
*G06F 12/121* (2016.01)
*G06F 12/123* (2016.01)
*G06F 12/122* (2016.01)
*G11C 16/26* (2006.01)
*G11C 16/04* (2006.01)

(52) U.S. Cl.
CPC .......... *G06F 12/124* (2013.01); *G06F 12/122* (2013.01); *G11C 16/26* (2013.01); *G06F 2212/1044* (2013.01); *G11C 16/0483* (2013.01)

(58) Field of Classification Search
CPC ................ G06F 12/12; G06F 12/121–123
USPC ....................................... 711/136
See application file for complete search history.

(56) References Cited

U.S. PATENT DOCUMENTS 10,346,303 B1 * 7/2019 Abrahms ............ G06F 9/5038
10,725,752 B1 * 7/2020 Wagner ................ G06F 8/433

FOREIGN PATENT DOCUMENTS

KR 10-2015-0037367 4/2015
KR 10-1826073 2/2018

* cited by examiner

*Primary Examiner* — Than Nguyen
(74) *Attorney, Agent, or Firm* — IP & T Group LLP

(57) ABSTRACT

A controller controls an operation of a semiconductor memory device. The controller includes a cache buffer, a request analyzer, and a cache controller. The cache buffer stores multiple cache data. The request analyzer generates request information including information on a size of read data to be read. The cache controller determines an eviction policy of the multiple cache data, based on the size of the read data in the request information.

14 Claims, 17 Drawing Sheets

FIG. 12A
| DATA | LRU Priority |
|---|---|
| C_DATA_01 | 6 |
| C_DATA_02 | 3 |
| C_DATA_03 | 2 |
| C_DATA_04 | 1 |
| C_DATA_05 | 5 |
| C_DATA_06 | 4 |
FIG. 12B
| DATA | LRU Priority |
|---|---|
| C_DATA_01 | 5 |
| C_DATA_02 | 6 |
| C_DATA_03 | 2 |
| C_DATA_04 | 1 |
| C_DATA_05 | 4 |
| C_DATA_06 | 3 |
FIG. 12C
| DATA | LRU Priority |
|---|---|
| C_DATA_01 | 4 |
| C_DATA_02 | 5 |
| C_DATA_03 | 1 |
| C_DATA_04 | 6 |
| C_DATA_05 | 3 |
| C_DATA_06 | 2 |
FIG. 12D
| DATA | LRU Priority |
|---|---|
| C_DATA_01 | 3 |
| C_DATA_02 | 4 |
| C_DATA_07 | 6 |
| C_DATA_04 | 5 |
| C_DATA_05 | 2 |
| C_DATA_06 | 1 |
C_DATA_07

FIG. 13A
| DATA | Cache Used Count |
|---|---|
| C_DATA_01 | 10 |
| C_DATA_02 | 20 |
| C_DATA_03 | 10 |
| C_DATA_04 | 10 |
| C_DATA_05 | 30 |
| C_DATA_06 | 5 |
FIG. 13B
| DATA | Cache Used Count |
|---|---|
| C_DATA_01 | 10 |
| C_DATA_02 | 21 |
| C_DATA_03 | 10 |
| C_DATA_04 | 10 |
| C_DATA_05 | 30 |
| C_DATA_06 | 5 |
FIG. 13C
| DATA | Cache Used Count |
|---|---|
| C_DATA_01 | 10 |
| C_DATA_02 | 21 |
| C_DATA_03 | 10 |
| C_DATA_04 | 11 |
| C_DATA_05 | 30 |
| C_DATA_06 | 5 |
FIG. 13D
| DATA | Cache Used Count |
|---|---|
| C_DATA_01 | 10 |
| C_DATA_02 | 21 |
| C_DATA_03 | 10 |
| C_DATA_04 | 11 |
| C_DATA_05 | 30 |
| C_DATA_07 | 0 |
C_DATA_07

FIG. 14A

| DATA | LRU Priority |
|---|---|
| C_DATA_01 | 6 |
| C_DATA_02 | 3 |
| C_DATA_03 | 2 |
| C_DATA_04 | 1 |
| C_DATA_05 | 5 |
| C_DATA_06 | 4 |

FIG. 14B

| DATA | LRU Priority |
|---|---|
| C_DATA_01 | 5 |
| C_DATA_02 | 2 |
| C_DATA_03 | 1 |
| C_DATA_10 | 6 |
| C_DATA_05 | 4 |
| C_DATA_06 | 3 |

← C_DATA_10

FIG. 14C

| DATA | LRU Priority |
|---|---|
| C_DATA_01 | 4 |
| C_DATA_02 | 1 |
| C_DATA_11 | 6 |
| C_DATA_10 | 5 |
| C_DATA_05 | 3 |
| C_DATA_06 | 2 |

← C_DATA_11

FIG. 14D

| DATA | LRU Priority |
|---|---|
| C_DATA_01 | 3 |
| C_DATA_12 | 6 |
| C_DATA_11 | 5 |
| C_DATA_10 | 4 |
| C_DATA_05 | 2 |
| C_DATA_06 | 1 |

← C_DATA_12

| DATA | LRU Priority |
|---|---|
| C_DATA_01 | 2 |
| C_DATA_12 | 5 |
| C_DATA_11 | 4 |
| C_DATA_10 | 3 |
| C_DATA_05 | 1 |
| C_DATA_13 | 6 |

C_DATA_13

| DATA | LRU Priority |
|---|---|
| C_DATA_01 | 1 |
| C_DATA_12 | 4 |
| C_DATA_11 | 3 |
| C_DATA_10 | 2 |
| C_DATA_14 | 6 |
| C_DATA_13 | 5 |

C_DATA_14

| DATA | LRU Priority |
|---|---|
| C_DATA_15 | 6 |
| C_DATA_12 | 3 |
| C_DATA_11 | 2 |
| C_DATA_10 | 1 |
| C_DATA_14 | 5 |
| C_DATA_13 | 4 |

C_DATA_15

FIG. 15A
| DATA | LRU Priority | Cache Used Count |
|---|---|---|
| C_DATA_01 | 6 | 10 |
| C_DATA_02 | 3 | 20 |
| C_DATA_03 | 2 | 10 |
| C_DATA_04 | 1 | 10 |
| C_DATA_05 | 5 | 30 |
| C_DATA_06 | 4 | 5 |
FIG. 15B
| DATA | LRU Priority | Cache Used Count |
|---|---|---|
| C_DATA_01 | 5 | 10 |
| C_DATA_02 | 3 | 20 |
| C_DATA_03 | 2 | 10 |
| C_DATA_04 | 1 | 10 |
| C_DATA_05 | 4 | 30 |
| C_DATA_10 | 6 | 0 |
C_DATA_10
FIG. 15C
| DATA | LRU Priority | Cache Used Count |
|---|---|---|
| C_DATA_01 | 5 | 10 |
| C_DATA_02 | 3 | 20 |
| C_DATA_03 | 2 | 10 |
| C_DATA_04 | 1 | 10 |
| C_DATA_05 | 4 | 30 |
| C_DATA_11 | 6 | 0 |
C_DATA_11

| DATA | LRU Priority | Cache Used Count |
|---|---|---|
| C_DATA_01 | 5 | 10 |
| C_DATA_02 | 3 | 20 |
| C_DATA_03 | 2 | 10 |
| C_DATA_04 | 1 | 10 |
| C_DATA_05 | 4 | 30 |
| C_DATA_12 | 6 | 0 |

C_DATA_12

| DATA | LRU Priority | Cache Used Count |
|---|---|---|
| C_DATA_01 | 5 | 10 |
| C_DATA_02 | 3 | 20 |
| C_DATA_03 | 2 | 10 |
| C_DATA_04 | 1 | 10 |
| C_DATA_05 | 4 | 30 |
| C_DATA_15 | 6 | 0 |

C_DATA_15

| DATA | LRU Priority | Cache Used Count |
|---|---|---|
| C_DATA_01 | 4 | 10 |
| C_DATA_02 | 2 | 20 |
| C_DATA_03 | 1 | 10 |
| C_DATA_20 | 6 | 0 |
| C_DATA_05 | 3 | 30 |
| C_DATA_15 | 5 | 0 |

C_DATA_20

CONTROLLER USING CACHE EVICTION POLICY BASED ON READ DATA SIZE

CROSS-REFERENCE TO RELATED APPLICATION

The present application claims priority under 35 U.S.C. § 119(a) to Korean patent application number 10-2018-0172800, filed on Dec. 28, 2018, which is incorporated herein by reference in its entirety.

BACKGROUND

Field of Invention

The present disclosure generally relates to an electronic device, and more particularly, to a controller for a semiconductor memory device and an operating method thereof.

Description of Related Art

Semiconductor memory devices may be formed in a two-dimensional structure in which strings are arranged horizontally to a semiconductor substrate, or be formed in a three-dimensional structure in which strings are arranged vertically to a semiconductor substrate. A three-dimensional semiconductor memory device is devised so as to overcome the limit of degree of integration in two-dimensional semiconductor memory devices, and may include a plurality of memory cells vertically stacked on a semiconductor substrate. A controller may control an operation of the semiconductor memory device.

SUMMARY

Embodiments provide a controller capable of efficiently using a cache buffer and an operating method thereof.

In accordance with an aspect of the present disclosure, there is provided a controller for controlling an operation of a semiconductor memory device, the controller including: a cache buffer configured to store multiple cache data; a request analyzer configured to generate request information including information on a size of read data to be read corresponding to a read request received from a host; and a cache controller configured to determine an eviction policy of the multiple cache data, based on the size of the read data in the request information.

In accordance with another aspect of the present disclosure, there is provided a method for operating a controller for controlling an operation of a semiconductor memory device, the method including: receiving a read request of data from a host; determining an eviction policy of a cache buffer, based on a size of read data corresponding to the received read request; and deleting a cache data of multiple cache data stored in the cache buffer, based on the determined eviction policy.

In accordance with still another aspect of the present disclosure, there is provided a memory system including: a semiconductor memory device including a plurality of memory cells for storing a plurality of data; and a controller configured to control an operation of the semiconductor memory device, and store, as multiple cache data, some data among the plurality of data, wherein the controller receives a read request from a host, and evicts a cache data among the multiple cache data, based on a size of read data to be read corresponding to the read request.

In accordance with still another aspect of the present disclosure, there is provided a memory system including: a memory device including a plurality of areas for storing a plurality of data; and a controller. The controller includes: a cache buffer suitable for caching a subset of data among the plurality of data; and a cache controller configured to determine whether a capacity of the cache buffer is less than a size of read data read from the memory device. In addition, when the capacity of the cache buffer is less than the size of read data, the cache controller is further configured to evict a select cache data among the subset of data from the cache buffer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 12A to 12D are diagrams exemplarily illustrating a cache information table for describing management of the cache buffer according to a Least Recently Used (LRU) algorithm.

FIGS. 13A to 13D are diagrams exemplarily illustrating a cache information table for describing management of the cache buffer according to a cache-used count algorithm.

FIGS. 14A to 14G are diagrams illustrating a case where cache data is evicted according to the LRU algorithm when large-capacity data is read.

FIGS. 15A to 15F are diagrams illustrating a process of controlling data of the cache buffer through the controller and the operating method thereof in accordance with an embodiment of the present disclosure.

DETAILED DESCRIPTION

Figure 1:
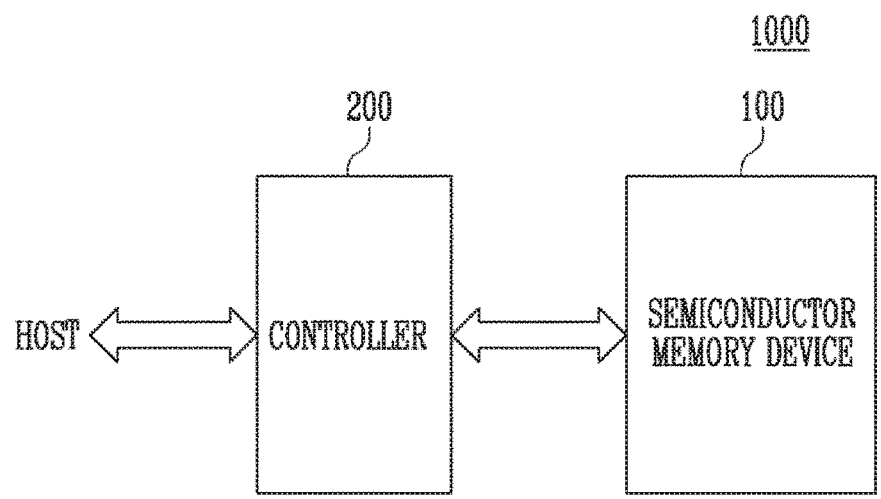
FIG. 1 is a block diagram illustrating an example of a memory system.

In the present disclosure, advantages, features, and methods for achieving the advantages and features will become more apparent after a reading of the following exemplary embodiments taken in conjunction with the drawings. The present disclosure may, however, be embodied in different forms and should not be construed as being limited to the embodiments set forth herein. Rather, these embodiments are provided to describe the present disclosure in detail to the extent that those skilled in the art to which the disclosure pertains may easily enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure which states otherwise.

Hereinafter, exemplary embodiments of the present disclosure will be described in detail with reference to the accompanying drawings. The same reference numerals are used to designate the same elements as those shown in other drawings. In the following descriptions, only portions necessary for understanding operations in accordance with the exemplary embodiments may be described, and descriptions of the other portions may be omitted so as to not obscure important concepts of the embodiments.

FIG. 1 is a block diagram illustrating an example of a memory system.

Referring to FIG. 1, the memory system 1000 includes a semiconductor memory device 100 and a controller 200.

The semiconductor memory device 100 operates under the control of the controller 200. More specifically, the semiconductor memory device 100 writes data in a memory cell array in response to a write request from the controller 200. When a write command, an address, and data are received as the write request from the controller 200, the semiconductor memory device 100 writes the data in the memory cells indicated by the address.

The semiconductor memory device 100 performs a read operation in response to a read request from the controller 200. When a read command and an address are received as the read request from the controller 200, the semiconductor memory device 100 reads data of memory cells indicated by the address, and outputs the read data to the controller 200.

The semiconductor memory device 100 may be a NAND flash memory, a vertical NAND (hereinafter, referred to as 'VNAND') flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. Also, the semiconductor memory device 100 of the present disclosure may be implemented in a three-dimensional array structure. The present disclosure may be applied to not only a flash memory device in which a charge storage layer is configured with a conductive floating gate but also a Charge Trap Flash (CTF) in which a charge storage layer is configured with an insulating layer.

The controller 200 is coupled between the semiconductor memory device 100 and a host HOST. The controller 200 interfaces between the host HOST and the semiconductor memory device 100. The controller 200 may transmit a write request or read request to the semiconductor memory device 100 under the control of the host HOST.

Figure 2:
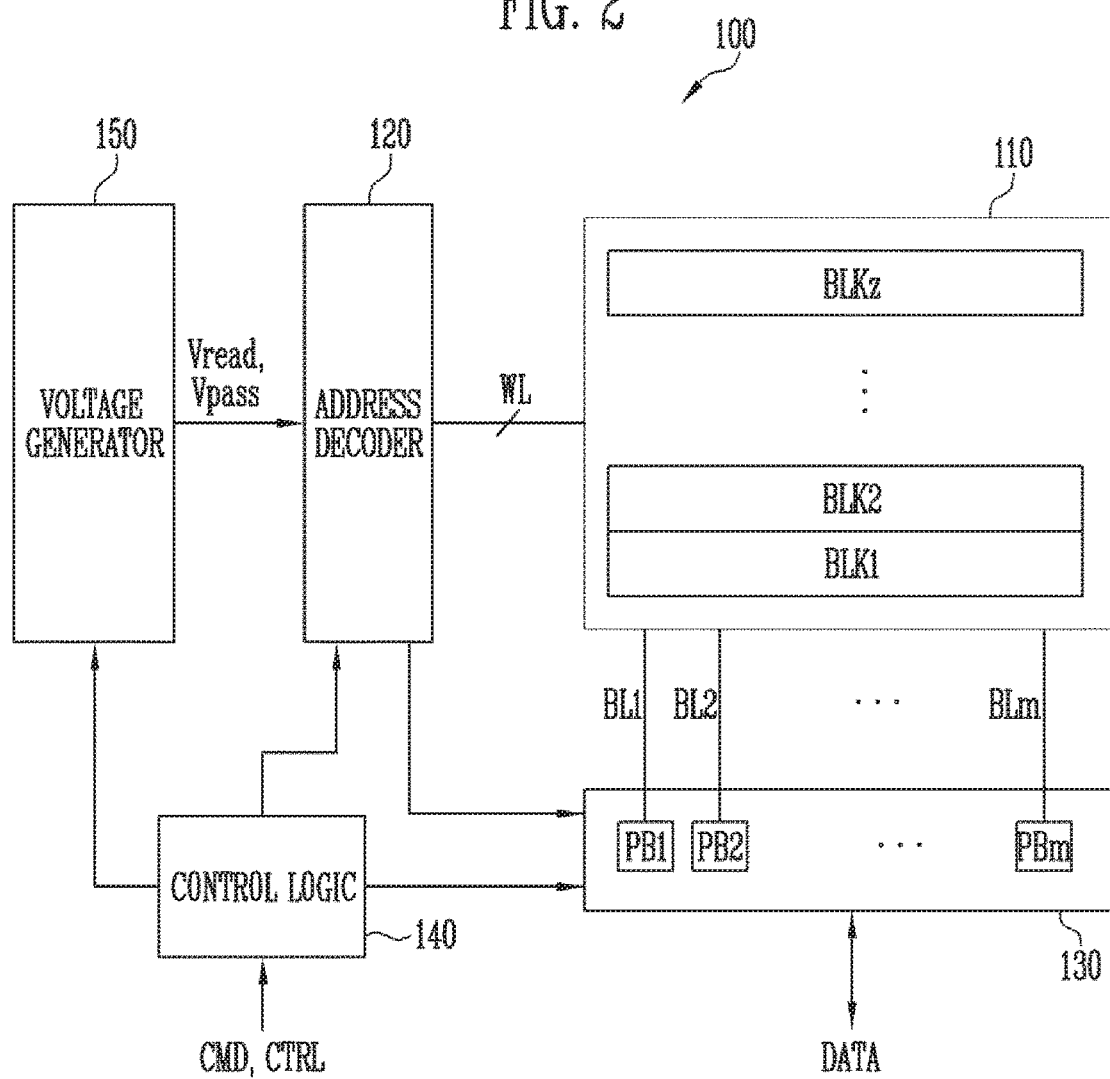
FIG. 2 is a block diagram illustrating a semiconductor memory device shown in FIG. 1.

FIG. 2 is a block diagram illustrating the semiconductor memory device shown in FIG. 1.

Referring to FIG. 2, the semiconductor memory device 100 includes a memory cell array 110, an address decoder 120, a read and write (read/write) circuit 130, a control logic 140, and a voltage generator 150.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the plurality of memory cells are nonvolatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells in the memory cell array 110 may store data of at least one bit. In an embodiment, each of the plurality of memory cells in the memory cell array 110 may be a single-level cell (SLC) that stores data of one bit. In another embodiment, each of the plurality of memory cells in the memory cell array 110 may be a multi-level cell (MLC) that stores data of two bits. In still another embodiment, each of the plurality of memory cells in the memory cell array 110 may be a triple-level cell (TLC) that stores data of three bits. In still another embodiment, each of the plurality of memory cells in the memory cell array 110 may be a quad-level cell (QLC) that stores data of four bits. In some embodiments, the memory cell array 110 may include a plurality of memory cells that each stores data of five or more bits.

The address decoder 120, the read/write circuit 130, the control logic 140, and the voltage generator 150 operate as a peripheral circuit that drives the memory cell array 110. The address decoder 120 is coupled to the memory cell array 110 through the word lines WL. The address decoder 120 operates under the control of the control logic 140. The address decoder 120 receives an address through an input/output buffer (not shown) provided in the semiconductor memory device 100.

The address decoder 120 decodes a block address in the received address. The address decoder 120 selects at least one memory block according to the decoded block address. In a read voltage application operation during a read operation, the address decoder 120 applies a read voltage Vread to a selected word line among the selected memory blocks, and applies a pass voltage Vpass to the other unselected word lines. In a program verify operation, the address decoder 120 applies a verify voltage to the selected word line among the selected memory blocks, and applies the pass voltage Vpass to the other unselected word lines. The read voltage Vread, the verify voltage and the pass voltage Vpass may be generated by the voltage generator 150.

The address decoder 120 decodes a column address in the received address. The address decoder 12 transmits the decoded column address to the read/write circuit 130.

Read and program operations of the semiconductor memory device 100 are performed in units of pages. An address received in a request of the read operation and the program operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder and an address buffer.

The read/write circuit 130 includes a plurality of page buffers PB1 to PBm. The read/write circuit 130 may operate as a "read circuit" in a read operation of the memory cell array 110, and operate as a "write circuit" in a write operation of the memory cell array 110. The plurality of page buffers PB1 to PBm are connected to the memory cell array 110 through the bit lines BL1 to BLm. In order to sense threshold voltages of memory cells in the read operation and the program verify operation, the plurality of page buffers PB1 to PBm sense a change in amount of current flowing depending on a program state of a corresponding memory cell while continuously supplying sensing current to bit lines connected to the memory cells, and latch the sensed change as sensing data. The read/write circuit 130 operates in response to page buffer control signals output from the control logic 140.

In the read operation, the read/write circuit 130 senses data of a memory cell, and temporarily stores read data by sensing data of a memory cell and then outputs data DATA to the input/output buffer (not shown) of the semiconductor memory device 100. In an exemplary embodiment, the read/write circuit 130 may include a column selection circuit, in addition to the page buffers (or page registers).

The control logic 140 is connected to the address decoder 120, the read/write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. Also, the control logic 140 outputs a control signal for controlling sensing node precharge potential levels of the plurality of page buffers PB1 to PBm. The control logic 140 may control the read/write circuit 130 to perform the read operation of the memory cell array 110.

In the read operation, the voltage generator 150 generates the read voltage Vread and the pass voltage Vpass in response to a control signal output from the control logic 140. In order to generate a plurality of voltages having various voltage levels, the voltage generator 150 may include a plurality of pumping capacitors for receiving an internal power voltage. Further, the voltage generator 150 may generate a plurality of voltages by selectively activating the plurality of pumping capacitors under the control of the control logic 140.

The address decoder 120, the read/write circuit 130, and the voltage generator 150 may serve as a "peripheral circuit" that performs a read operation, a write operation, and an erase operation on the memory cell array 110. The peripheral circuit performs the read operation, the write operation, and the erase operation on the memory cell array 110 under the control of the control logic 140.

Figure 3:
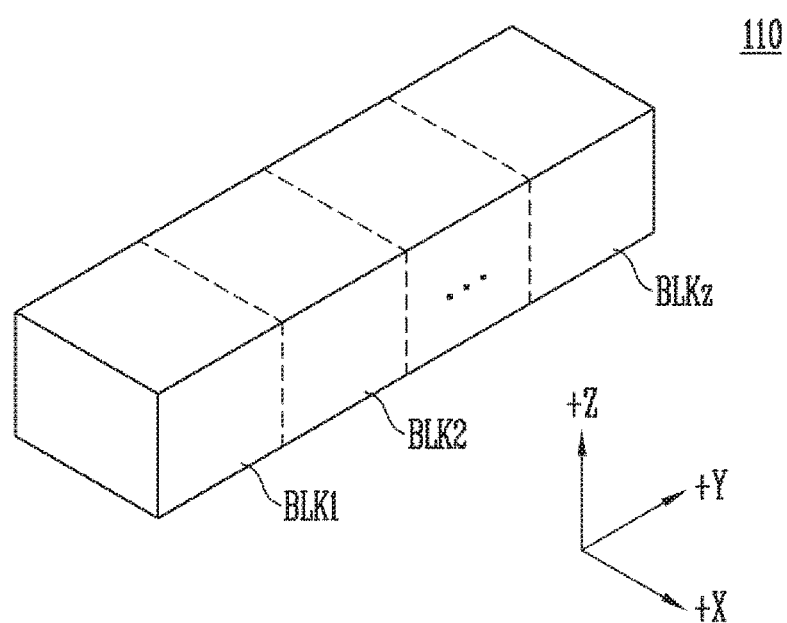
FIG. 3 is a diagram illustrating an embodiment of a memory cell array shown in FIG. 2.

FIG. 3 is a diagram illustrating an example of the memory cell array 110 shown in FIG. 2.

Referring to FIG. 3, the memory cell array 110 includes a plurality of memory blocks BLK1 to BLKz. Each memory block has a three-dimensional structure. Each memory block includes a plurality of memory cells stacked above a substrate. The plurality of memory cells are arranged along +X, +Y, and +Z directions. The structure of each memory block will be described in more detail with reference to FIGS. 4 and 5.

Figure 4:
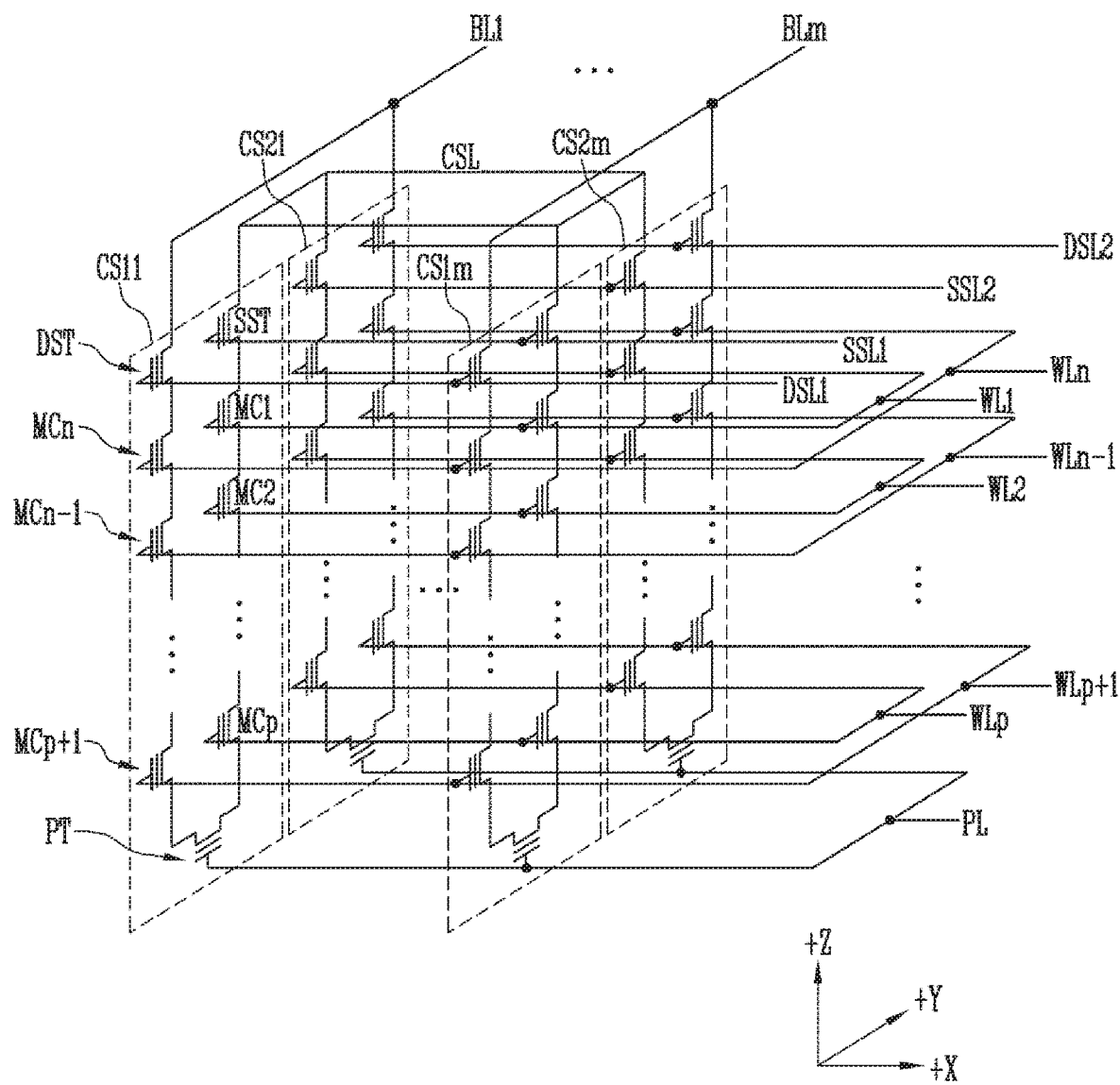
FIG. 4 is a circuit diagram illustrating any one memory block among memory blocks shown in FIG. 3.

FIG. 4 is a circuit diagram illustrating a memory block BLKa among a plurality of memory blocks BLK1 to BLKz shown in FIG. 3.

Referring to FIG. 4, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). In FIG. 4, it is illustrated that two cell strings are arranged in a column direction (i.e., a +Y direction). However, this is for convenience, and it will be understood that three cell strings may be arranged in the column direction.

Each of the plurality of cell strings CS11 to CS1m and CS21 to CS2m includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. When any one of the drain select lines DSL1 and DSL2 is selected, cell strings arranged in one row direction may be selected. When any one of the word lines WL1 to WLn is selected, one page may be selected in the selected cell strings.

In another embodiment, even bit lines and odd bit lines may be provided instead of the first to mth bit lines BL1 to BLm. Even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. The size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, by controlling a voltage applied to the dummy word lines coupled to the respective dummy memory cells, the dummy memory cells can have the required threshold voltage.

Figure 5:
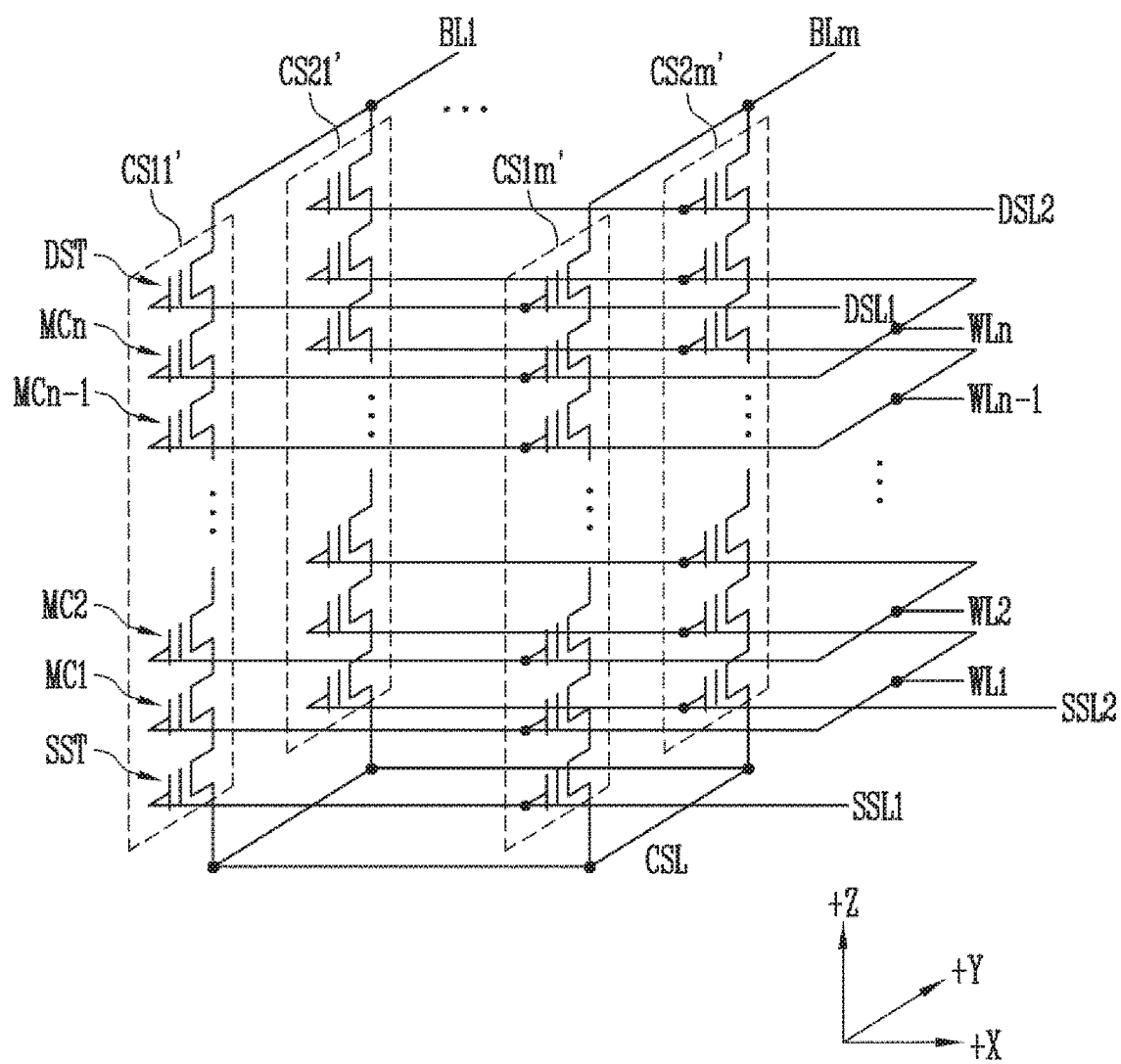
FIG. 5 is a circuit diagram illustrating another embodiment of the one memory block among the memory blocks shown in FIG. 3.

FIG. 5 is a circuit diagram illustrating a memory block BLKb among a plurality of memory blocks BLK1 to BLKz shown in FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit identical to that of the memory block BLKa of FIG. 4, except that the pipe transistor PT is excluded from each cell string.

In another embodiment, even bit lines and odd bit lines may be provided instead of the first to mth bit lines BL1 to BLm. Even-numbered cell strings among the cell strings CS11' to CS1m' or CS21' to CS2m' arranged in the row direction may be coupled to the even bit lines, respectively. Odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. When the number of dummy memory cells increases, the reliability of an operation of the memory block BLKb is improved. The size of the memory block BLKb increases. When the number of dummy memory cells decreases, the size of the memory block BLKb decreases. The reliability of an operation of the memory block BLKb may be deteriorated.

To efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, by controlling a voltage applied to the dummy word lines coupled to the respective dummy memory cells, the dummy memory cells can have the required threshold voltage.

Figure 6:
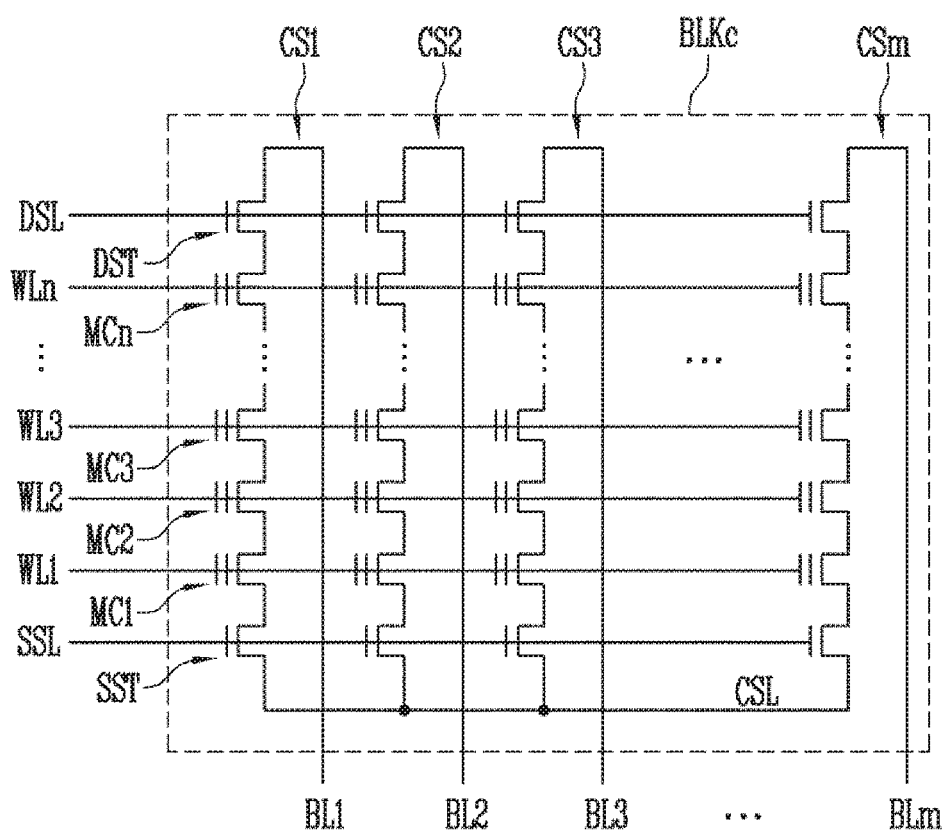
FIG. 6 is a circuit diagram illustrating an embodiment of any one memory block among a plurality of memory blocks included in the memory cell array shown in FIG. 2.

FIG. 6 is a circuit diagram illustrating a memory block BLKc among a plurality of memory blocks BLK1 to BLKz in the memory cell array 110 shown in FIG. 2.

Referring to FIG. 6, the memory block BLKc includes a plurality of strings CS1 to CSm. The plurality of strings CS1 to CSm may be coupled to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to nth memory cells MC1 to MCn of each cell string is coupled between the source select transistor SST and the drain select transistor DST.

The drain select transistor DST of each cell string is coupled between a corresponding bit line and the memory cells MC1 to MCn.

Memory cells coupled to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm may be coupled to the even bit lines, respectively. Odd-numbered cell strings among the cell strings CS1 to CSm may be coupled to the odd bit lines, respectively.

As shown in FIGS. 3 to 5, the memory cell array 110 of the semiconductor memory device 100 may be configured as a memory cell array having a three-dimensional structure. In addition, as shown in FIG. 6, the memory cell array 110 of the memory device 100 may be configured as a memory cell array having a two-dimensional structure.

Figure 7:
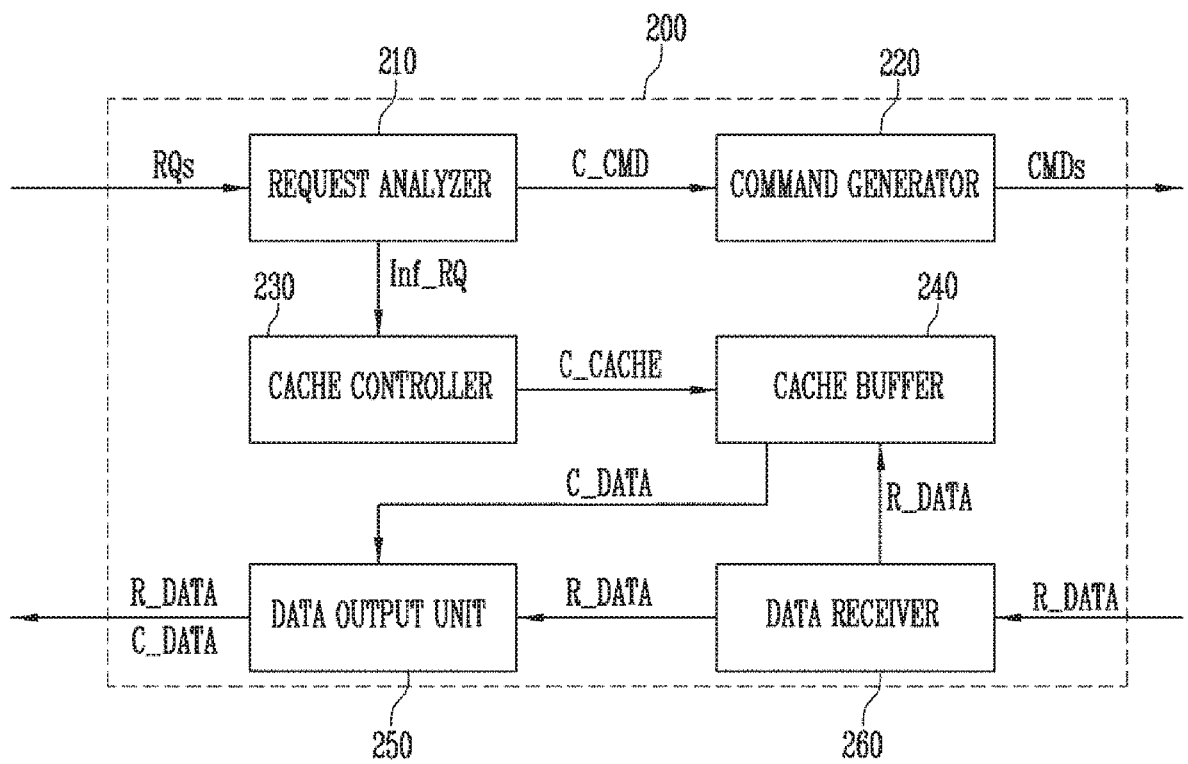
FIG. 7 is a block diagram illustrating a controller in accordance with an embodiment of the present disclosure.

FIG. 7 is a block diagram illustrating a controller 200 in accordance with an embodiment of the present disclosure.

Referring to FIG. 7, the controller 200 may include a request analyzer 210, a command generator 220, a cache controller 230, a cache buffer 240, a data output unit 250, and a data receiver 260. The request analyzer 210 may generate a command control signal C_CMD by analyzing requests RQs received from the host. The command generator 220 may generate commands CMDs, based on the command control signal C_CMD. The commands CMDs are transferred to the semiconductor memory device 100. Accordingly, the semiconductor memory device 100 may perform an operation corresponding to a request RQs from the host.

In order to improve read performance of the memory system 1000, the controller 200 may include the cache buffer 240. The cache buffer 240 may be configured with a random access memory having a fast operation speed, and store a portion of data stored in the semiconductor memory device 100. When the request received from the host is a read request and when data corresponding to the corresponding read request is stored in the cache buffer 240, the controller 200 does not generate a read command corresponding to the read request. Instead, the controller 200 transfers, to the host, the data stored in the cache buffer 240, i.e., cache data. The read speed of the memory system 1000 may be remarkably improved.

When a read request is received from the host, the request analyzer 210 may generate request information Inf_RQ corresponding to the read request and transfer the request information Inf_RQ to the cache controller 230.

The cache controller 230 may control an operation of the cache buffer 240. In order to control the operation of the cache buffer 240, the cache controller 230 may generate a cache control signal C_CACHE and transfer the cache control signal C_CACHE to the cache buffer 240. The cache controller 230 may determine whether data corresponding to the corresponding read request is stored in the cache buffer 240, based on the request information Inf_RQ received from the request analyzer 210. When the data corresponding to the read request is stored in the cache buffer 240, the cache controller 230 controls the cache buffer 240 to output corresponding cache data C_DATA through the cache control signal C_CACHE. The cache data C_DATA output by the cache buffer 240 is transferred to the data output unit 250. The data output unit 250 transfers the received cache data C_DATA to the host.

When the data corresponding to the read request is not stored in the cache buffer 240, the command generator 220 may generate a read command corresponding to the read request. The generated read command may be transferred to the semiconductor memory device 100. The semiconductor memory device 100 may perform a read operation corresponding to the received read command. Read data R_DATA that is a result of the read operation may be transferred from the semiconductor memory device 100 to the data receiver 260 of the controller 200. The data receiver 260 transfers the received read data R_DATA to the data output unit 250. The data output unit 250 transfers the received read data R_DATA to the host.

The data receiver 260 may transfer the received read data R_DATA to the cache buffer 240. The cache buffer 240 may store the received read data R_DATA to cache the read data R_DATA. That is, the received read data R_DATA is stored as cache data C_DATA in the cache buffer 240.

Figure 8:
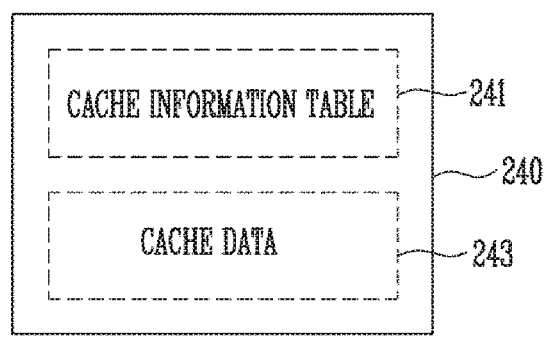
FIG. 8 is a diagram illustrating an example of data stored in a cache buffer shown in FIG. 7.

FIG. 8 is a diagram illustrating an example of data stored in the cache buffer 240 shown in FIG. 7.

Referring to FIG. 8, the cache buffer 240 may include a cache information table 241 and cache data 243. The cache data 243 may be data actually cached in the cache buffer 240. The cache data 243 may include a plurality of data segments.

The cache information table 241 may include information for managing the cache data 243, which is meta data of the cache data 243. For example, the cache information table 241 may include data for identifying the plurality of data segments in the cache data 243.

The cache information table 241 may include information on use records of the cache data 243. For example, the cache information table 241 may include data representing an order of priority (e.g., an order of least recently used (LRU) priority) of the plurality of segments in the cache data 243. The order of LRU priority may be determined by a time at which each cache data has been lastly used. That is, the order of LRU priority of cache data that was used long ago is high, and the order of LRU priority of cache data that was used just before is low. Also, the cache information table 241 may include data representing cache used counts of the plurality of data segments in the cache data 243. The cache information table 241 will be described later with reference to FIGS. 12A to 15F.

Although FIG. 8 illustrates a case where the cache information table 241 is stored in the cache buffer 240, the present disclosure is not limited thereto. For example, the cache information table 241 may be stored in the cache controller 230.

As shown in FIG. 7, when read data R_DATA is received from the semiconductor memory device 100, the received read data R_DATA may be cached in the cache buffer 240. However, the capacity of the cache buffer 240 is restrictive. Hence, when the cache buffer 240 is fully filled with cache data C_DATA, a portion of the cache data C_DATA is to be evicted from the cache buffer 240 so as to additionally cache the read data R_DATA. To this end, it is important which data among the cache data C_DATA stored in the cache buffer 240 is to be determined as victim cache data that is a target to be evicted. A policy for determining the victim cache data is referred to as a cache management policy, and cache management policies using various schemes exist.

For example, a least recently used (LRU) algorithm may determine, as the victim cache data, cache data that was used longest ago (or unused for a longest time) among several cache data stored in the cache buffer 240. A most recently used (MRU) algorithm may determine, as the victim cache data, cache data that has most recently used among several cache data stored in the cache buffer 240. In addition, a first-in first-out (FIFO) algorithm may determine, as the victim cache data, cache data that was stored for a longest time among several cache data stored in the cache buffer 240. A least frequently used (LFU) algorithm may determine, as the victim cache data, cache data having a lowest use frequency among several cache data stored in the cache buffer 240. A cache-used count algorithm may determine, as the victim cache data, cache data having a least used count number among several cache data stored in the cache buffer 240.

In relation to features of data caching, the possibility that cache data that was used longest ago (or unused for a longest time) will be used in the future may be low. Accordingly, the LRU algorithm is widely used as the cache management policy. However, in some situations, inefficiency may occur when the cache buffer is managed according to the LRU algorithm.

In various embodiments, different cache management policies may be determined according to the size of read data corresponding to the read request received from the host. For example, when the size of read data corresponding to the read request is greater than a predetermined reference value, the victim cache data may be determined using the cache-used count algorithm. When the size of read data corresponding to the read request is less than or equal to the predetermined reference value, the victim cache data may be determined using the LRU algorithm. According to this scheme, when typical data having a small size is read, cache data that was unused for a longest time is evicted according to the LRU algorithm. When large-capacity data such as a moving image file are consecutively read, cache data having a least used count number is evicted according to the cache-used count algorithm, so that the situation in which the existing cache data are all deleted from the cache buffer is prevented. Accordingly, the cache performance of the memory system is improved. In some embodiments, when the size of read data corresponding to the read request is greater than the predetermined reference value, the LFU algorithm or the MRU algorithm may be used rather than the cache-used count algorithm.

Figure 9:
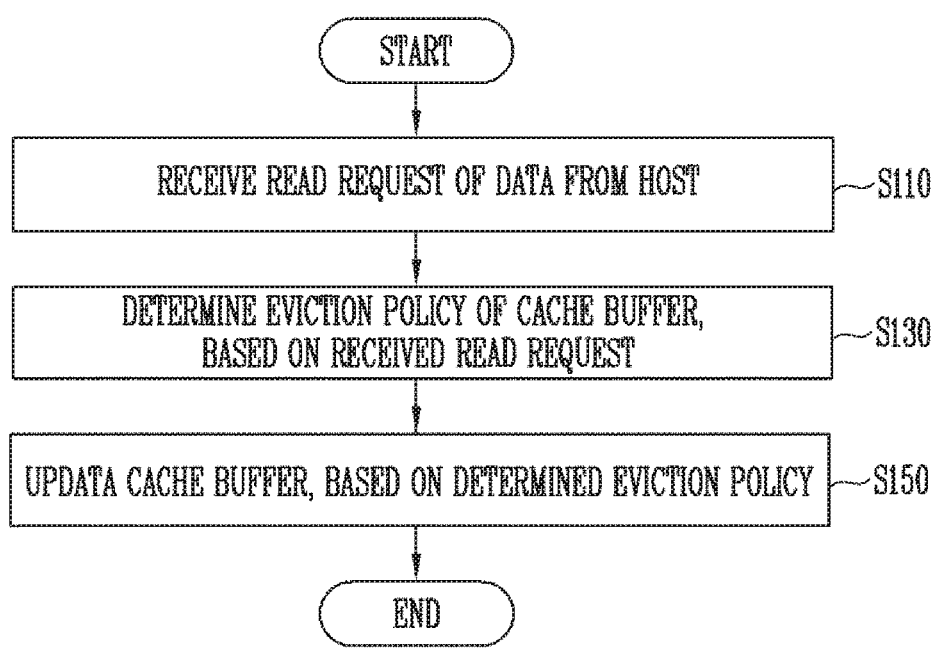
FIG. 9 is a flowchart illustrating an operating method of the controller in accordance with an embodiment of the present disclosure.

FIG. 9 is a flowchart illustrating an operating method of a controller in accordance with an embodiment of the present disclosure, for example, the controller 200 of FIG. 7.

Referring to FIG. 9, the operating method includes step S110, step S130 and step S150. Step S110 may include receiving a read request of data from the host. Step S130 may include determining an eviction policy of the cache buffer, based on the received read request. Step S150 may include updating the cache buffer, based on the determined eviction policy.

At the step S110, a read request of data is received from the host. The step S110 may be performed by the request analyzer 210 of the controller 200. A read command may be transferred to the semiconductor memory device 100, based on the received read request. Subsequently, read data may be received from the semiconductor memory device 100. When the capacity of the cache buffer 240 is insufficient at the time when the read data is received, victim cache data becomes a target to be evicted among cache data.

At the step S130, an eviction policy of the cache buffer 240 may be determined based on the received read request. The step S130 may be performed by the cache controller 230. The read request may include information on a logical address and a data size of data to be read. The request analyzer 210 may transfer, to the cache controller 230, request information Inf_RQ including information on a data size of data to be read. The cache controller 230 may determine an eviction policy of the cache buffer 240, based on the information on the data size in the request information Inf_RQ.

At the step S150, the cache buffer 240 may be updated based on the determined eviction policy. Victim cache data may be selected according to the determined eviction policy, and the selected victim cache data may be evicted from the cache buffer 240. After the victim cache data is evicted, the read data received from the semiconductor memory device 100 may be stored in the cache buffer 240.

In the embodiment shown in FIG. 9, features for determining the eviction policy of the cache buffer 240 are mainly illustrated. The entire management method of the cache buffer 240 including the features for determining the eviction policy of the cache buffer 240 will be described with reference to FIG. 10.

Figure 10:
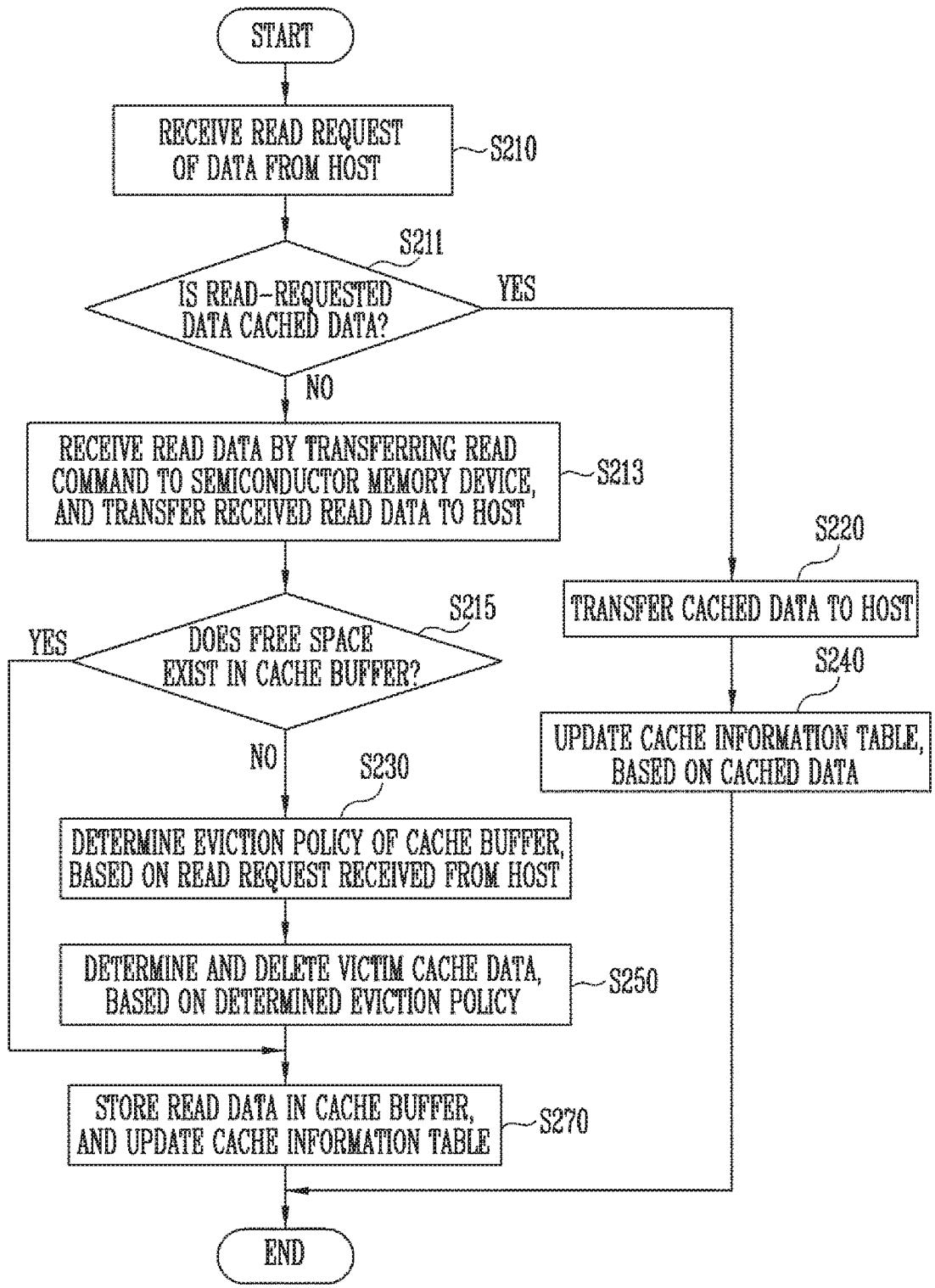
FIG. 10 is a diagram illustrating in more detail an operating method of the controller in accordance with an embodiment of the present disclosure.

FIG. 10 is a diagram illustrating in more detail an operating method of a controller (e.g., the controller 200 of FIG. 7) in accordance with an embodiment of the present disclosure. Hereinafter, the embodiment of the present disclosure will be described with reference to FIGS. 7 to 10 together.

Referring to FIG. 10, at step S210, the request analyzer 210 may receive a read request of data from the host. The step S210 shown in FIG. 10 may be substantially identical to the step S110 shown in FIG. 9.

At step S211, it is determined whether the read-requested data is data cached in the cache buffer 240. The cache controller 230 may perform the step S211 with reference to the cache information table 241 shown in FIG. 8.

When it is determined that the read-requested data is cached in the cache buffer 240 (S211, YES), the operating method proceeds to step S220. At the step S220, cache data C_DATA stored in the cache buffer 240 may be transferred to the host through the data output unit 250.

Subsequently, at step S240, the cache information table 241 is updated based on cache management policies. When the cache information table 241 stores an LRU priority for the LRU algorithm, the LRU priority of the cache information table 241 is updated. When the cache information table 241 stores a use frequency value for the LFU algorithm, the use frequency value of cache data used in the cache information table 241 may be updated. When the cache information table 241 stores a cache-used count for the cache-used count algorithm, the cache-used count value of cache data used in the cache information table 241 may be increased by 1. In addition, the cache information table 241 may be updated according to features of various cache management policies.

When it is determined that the read-request data is not cached in the cache buffer 240 (S211, NO), the operating method proceeds to step S213. At the step S213, the command generator 220 may transfer a read command to the semiconductor memory device 100. Also, at the step S213, the data receiver 260 may receive read data R_DATA corresponding to the read command from the semiconductor memory device 100. At the step S213, the data output unit 250 may transfer the received read data R_DATA to the host.

The output of read data corresponding to the read request received from the host is completed by performing the step S213. Subsequent steps S215, S230, S250, and S270 are steps representing a method for storing the read data received from the semiconductor memory device 100 in the cache buffer 240 in accordance with an embodiment of the present disclosure.

At step S215, it is determined whether a free space exists in the cache buffer 240. When it is determined that the free space exists in the cache buffer 240 (S215, YES), the read data received from the semiconductor memory device 100 may be stored in the cache buffer 240 without evicting the cache data. Accordingly, the operating method proceeds immediately to the step S270, to store the read data in the cache buffer 240 and update the cache information table 241.

When it is determined that the free space does not exist in the cache buffer 240 (S215, NO), a portion of the cache data may be evicted. In various embodiments, at step S230, an eviction policy of the cache buffer 240 may be determined based on the read request received from the host. More specifically, the eviction policy of the cache buffer 240 may be determined according to the size of read data corresponding to the read request received from the host. A more detailed embodiment of the step S230 will be described later with reference to FIG. 11.

At the step S250, victim cache data that becomes a target to be evicted among the cache data stored in the cache buffer 240, may be determined based on the determined eviction policy. The determined victim cache data may be deleted from the cache buffer 240. The step S250 may be performed by the cache controller 230.

A free space will be generated in the cache buffer 240 through the step S250. Therefore, at the step S270, the read data received from the semiconductor memory device 100 may be stored in the cache buffer 240, and the cache information table 241 may be updated.

Figure 11:
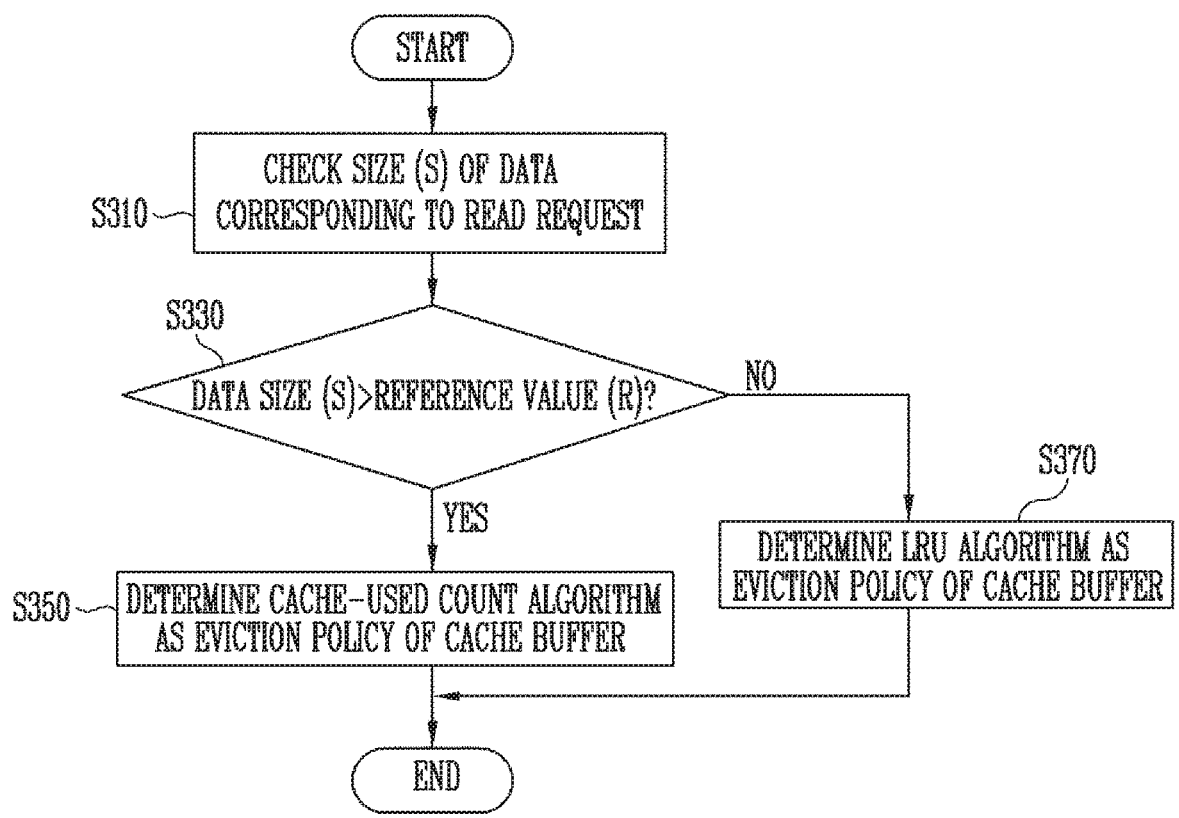
FIG. 11 is a diagram illustrating an exemplary embodiment of the step shown in FIG. 10.

FIG. 11 is a diagram illustrating an exemplary embodiment of the step S230 shown in FIG. 10.

Referring to FIG. 11, the step S230 may include determining the eviction policy of the cache buffer 240, based on the read request received from the host. The step S230 may include step S310 and step S330. The step S310 may include checking a size (S) of data corresponding to the read request. The step S330 may include comparing the data size (S) with a predetermined reference value (R).

As described above, the read request received from the host may include information on a logical address and a data size of data to be read. At the step S310, the size (S) of data to be read may be checked by analyzing the read request. The size (S) of the data may represent how many data segments the data to be read includes, i.e., how many page data the data to be read includes.

When the size (S) of the data to be read is greater than the predetermined reference value (R) (S330, YES), the cache-used count algorithm may be determined as the eviction policy of the cache buffer 240 at step S350. A method for evicting cache data of the cache buffer 240 according to the cache-used count algorithm will be described later with reference to FIGS. 13A to 13D.

When the size (S) of the data to be read is less than or equal to the predetermined reference value (R) (S330, NO), the LRU algorithm may be determined as the eviction policy of the cache buffer 240 at step S370. A method for evicting cache data of the cache buffer 240 according to the LRU algorithm will be described later with reference to FIGS. 12A to 12D.

FIGS. 12A to 12D are diagrams exemplarily illustrating a cache information table (e.g., the cache information table of FIG. 8) illustrating management of the cache buffer 240 according to the LRU algorithm. Although FIGS. 12A to 12D illustrate a case where the cache buffer 240 can store six cache data, the cache buffer 240 may store a larger number of cache data.

Referring to FIGS. 12A to 12D, in order to manage the cache buffer 240 according to the LRU algorithm, the cache information table 241 may include an order of LRU priority of each cache data. The order of LRU priority may represent an order of priority of cache data selected as a target to be evicted according to the LRU algorithm. In FIGS. 12A to 12D, a highest LRU priority order may represent that corresponding cache data was used long ago, and may represent that the corresponding cache data should be evicted prior to the other cache data from the cache buffer 240.

Referring to FIG. 12A, six cache data C_DATA_01, C_DATA_02, C_DATA_03, C_DATA_04, C_DATA_05, and C_DATA_06 are stored in the cache buffer 240. Each cache data may be a data segment that becomes a unit of read. For example, each cache data may be a page data that is a read unit of the semiconductor memory device 100. Cache data having a highest LRU priority order, i.e., cache data having an order of LRU priority of 1 is the cache data C_DATA_04. This represents that the cache data C_DATA_04 is cache data that was used longest ago (or unused for a longest time) among currently cached data. Cache data having a lowest LRU priority order, i.e., cache data having an order of LRU priority of 6 is the cache data C_DATA_01. This represents that the cache data C_DATA_01 has most recently been used among the currently cached data.

Referring to FIG. 12B, a cache information table 241 may be updated when the cache data C_DATA_02 is used under the situation shown in FIG. 12A. That is, when a read request for the cache data C_DATA_02 is received from the host, the cache data C_DATA_02 in the cache buffer 240 may be transferred to the host. Since the cache data C_DATA_02 is used, orders of the LRU priority of the cache data are to be updated according to LRU algorithm.

In FIG. 12A, the order of LRU priority of the cache data C_DATA_02 was 3. However, when the cache data C_DATA_02 is used, the order of LRU priority of the cache data C_DATA_02 is updated as 6 as shown in FIG. 12B. As described above, in the LRU algorithm, the order of LRU priority of cache data that was most recently used is updated as a lowest value, i.e., 6 among the cache data existing in the cache buffer 240.

The orders of LRU priority of the cache data C_DATA_03 and C_DATA_04, which had orders of LRU priority higher than that of the cache data C_DATA_02, are not changed. On the other hand, the order of LRU priority of each of the cache data C_DATA_01, C_DATA_05, and C_DATA_06, which had LRU priority orders lower than that of the cache data C_DATA_02, is increased by 1.

Referring to FIG. 12C, a cache information table 241 may be updated when the cache data C_DATA_04 is used under the situation shown in FIG. 12B. That is, when a read request for the cache data C_DATA_04 is received from the host, the cache data C_DATA_04 stored in the cache buffer 240 may be transferred to the host. Since the cache data C_DATA_04 is used, the orders of LRU priority of the cache data are to be updated according to the LRU algorithm.

In FIG. 12B, the order of LRU priority of the cache data C_DATA_04 was 1. However, when the cache data C_DATA_04 is used, the order of LRU priority of the cache data C_DATA_04 is updated as 6 as shown in FIG. 12C. As described above, in the LRU algorithm, the order of LRU priority of cache data that was most recently used is updated to have a lowest value, i.e., 6 among the cache data existing in the cache buffer.

The other cache data C_DATA_01, C_DATA_02, C_DATA_03, C_DATA_05, and C_DATA_06 had orders of LRU priority lower than that of the cache data C_DATA_04, and therefore, the order of LRU priority of each of the corresponding cache data is increased by 1 as shown in FIG. 12C.

Referring to FIG. 12D, a cache information table 241 may be updated when new read data is stored as cache data C_DATA_07 in the cache buffer 240 under the situation shown in FIG. 12C. That is, when a read request for data that is not stored in the cache buffer 240 is received from the host, a read command is transferred to the semiconductor memory device 100, and read data corresponding to the read command is received from the semiconductor memory device 100. The received read data is transferred to the host, and is also stored in the cache buffer 240. The received read data is stored as the new cache data C_DATA_07 in the cache buffer 240.

When no free space exists in the cache buffer 240, any one of cache data currently stored in the cache buffer 240 is to be evicted. Referring to FIG. 12C, the cache data C_DATA_03 having the order of LRU priority which is highest is deleted from the cache buffer 240. Subsequently, the new cache data C_DATA_07 is stored in the cache buffer 240, and the cache information table 241 is updated as shown in FIG. 12D.

Since the newly stored cache data C_DATA_07 becomes data that has most recently been used, the cache data C_DATA_07 has an order of LRU priority of 6, which is lowest. The order of LRU priority of each of the other cache data C_DATA_01, C_DATA_02, C_DATA_04, C_DATA_05, and C_DATA_06 is increased by 1.

As shown in FIGS. 12A to 12D, when an eviction policy of the cache buffer 240 is determined according to the LRU algorithm, cache data that was used longest ago (or unused for a longest time) is deleted.

FIGS. 13A to 13D are diagrams exemplarily illustrating a cache information table (e.g., the cache information table 241 of FIG. 8) illustrating management of the cache buffer 240 according to the cache-used count algorithm.

Referring to FIGS. 13A to 13D, in order to manage the cache buffer 240 according to the cache-used count algorithm, the cache information table 241 may include a cache-used count of each cache data. The cache-used count may be a value representing the number at which corresponding cache data is used. When the cache-used count increases, the corresponding cache data is more frequently used. Therefore, when the cache-used count decreases, the cache data's worth may decrease, and the corresponding cache data should be evicted prior to the other cache data from the cache buffer 240.

Referring to FIG. 13A, cache data C_DATA_05 has been most frequently used (i.e., a cache-used count 30), and cache data C_DATA_06 has been least frequently used (i.e., a cache-used count 5). Referring to FIG. 13B, a cache information table 241 may be updated when cache data C_DATA_02 is used. That is, when a read request for the cache data C_DATA_02 is received, the cache data C_DATA_02 stored in the cache buffer 240 may be transferred to the host. The cache data C_DATA_02 is used, the cache-used count of the corresponding cache data C_DATA_02 is updated from 20 to 21. Referring to FIG. 13C, a cache information table 241 may be updated when cache data C_DATA_04 is used. When the cache data C_DATA_04 is used, the cache-used count of the corresponding cache data C_DATA_04 is updated from 10 to 11.

Referring to FIG. 13D, a cache information table 241 may be updated when new read data is stored as cache data C_DATA_07 in the cache buffer 240 under the situation shown in FIG. 13C. That is, when a read request for data that is not stored in the cache buffer 240 is received from the host, a read command is transferred to the semiconductor memory device 100, and a read data corresponding to the read command is received from the semiconductor memory device 100. The received read data is transferred to the host, and is also stored in the cache buffer 240. The received read data is stored as new cache data C_DATA_07 in the cache buffer 240.

When no free space exists in the cache buffer 240, any one of cache data currently stored in the cache buffer 240 should be evicted. Referring to FIGS. 13C and 13D, the cache data C_DATA_06 having the smallest cache-used count is deleted from the cache buffer 240. Subsequently, the new cache data C_DATA_07 is stored in the cache buffer 240, and the cache information table 241 is updated as shown in FIG. 13D.

The newly stored cache data C_DATA_07 has never been used as cache data, and therefore, the cache-used count of the cache data C_DATA_07 is initialized to 0.

As shown in FIGS. 13A to 13D, when an eviction policy of the cache buffer 240 is determined according to the cache-used count algorithm, cache data that has been relatively least frequently used is deleted.

FIGS. 14A to 14G are diagrams illustrating a case where cache data is evicted according to the LRU algorithm when large-capacity data is read.

Referring to FIG. 14A, a cache information table 241 may be in a state substantially identical to that of the cache information table shown in FIG. 12A. In FIG. 14A, cache data C_DATA_04 has a highest LRU priority order (i.e., 1), and cache data C_DATA_01 has a lowest LRU priority order (i.e., 6).

Subsequently, a cache information table 241 may be updated when new read data is stored as cache data C_DATA_10 in the cache buffer 240 under the situation shown in FIG. 14A. That is, when a read request for data that is not stored in the cache buffer 240 is received from the host, a read command is transferred to the semiconductor memory device 100, and a read data corresponding to the read command is received from the semiconductor memory device 100. The received read data is transferred to the host, and is also stored in the cache buffer 240. The received read data is stored as new cache data C_DATA_10 in the cache buffer 240. The cache data C_DATA_04 having the highest LRU priority order is deleted from the cache buffer 240. Subsequently, the new cache data C_DATA_10 is stored in the cache buffer 240, and the cache information table 241 is updated as shown in FIG. 14B.

Subsequently, a cache information table 241 may be updated when new read data is stored as cache data C_DATA_11 in the cache buffer 240 under the situation shown in FIG. 14B. Similar to FIG. 14B, when a read request for data that is not stored in the cache buffer 240 is received from the host, new cache data C_DATA_11 is stored in the cache buffer 240. Cache data having a highest LRU priority order is deleted from the cache buffer 240, and the new cache data C_DATA_11 is stored in the cache buffer 240. In addition, the cache information table 241 is updated as shown in FIG. 14C.

Subsequently, in FIG. 14D, a cache information table 241 may be updated when new read data is stored as cache data C_DATA_12 in the cache buffer 240 under the situation shown in FIG. 14C. Similar to FIG. 14C, when a read request for data that is not stored in the cache buffer 240 is received from the host, new cache data C_DATA_12 is stored in the cache buffer 240. Cache data C_DATA_02 having a highest LRU priority order is deleted from the cache buffer 240, and the new cache data C_DATA_12 is stored in the cache buffer 240. In addition, the cache information table 241 is updated as shown in FIG. 14D.

Figure 14E:
Figure 14F:
Figure 14G:

Subsequently, in FIG. 14E, a cache information table 241 may be updated when new read data is stored as cache data C_DATA_13 in the cache buffer 240 under the situation shown in FIG. 14D. In FIG. 14F, a cache information table 241 may be updated when new read data is stored as cache data C_DATA_14 in the cache buffer 240 under the situation shown in FIG. 14E. Finally, in FIG. 14G, a cache information table 241 may be updated when new read data is stored as cache data C_DATA_15 in the cache buffer 240 under the situation shown in FIG. 14F.

Referring to all of FIGS. 14A to 14G, when a read operation is consecutively performed on data that are not stored in the cache buffer 240, the following concern occurs when cache data to be evicted are determined according to the LRU algorithm. The existing cache data C_DATA_01, C_DATA_02, C_DATA_03, C_DATA_04, C_DATA_05, and C_DATA_06, which was stored in the cache buffer 240, are all evicted from the cache buffer 240, and data that are not stored in the cache buffer 240 are filled in the cache buffer 240.

When the cache data C_DATA_10, C_DATA_11, C_DATA_12, C_DATA_13, C_DATA_14, and C_DATA_15, which are newly stored in the cache buffer 240, correspond to a portion of a large-capacity file, e.g., a portion of a moving image file, the possibility that these data will be reused as cache data is low.

In addition, the existing cache data C_DATA_01, C_DATA_02, C_DATA_03, C_DATA_04, C_DATA_05, and C_DATA_06, which were stored in the cache buffer 240 and then evicted, may be cache data that have a cache use rate relatively higher than that of the cache data C_DATA_10, C_DATA_11, C_DATA_12, C_DATA_13, C_DATA_14, and C_DATA_15, which are newly stored in the cache buffer 240. The efficiency of the cache buffer 240 is lowered, and the entire performance of the memory system 1000 may be degraded.

In various embodiments, the size of data corresponding to the read request received from the host is checked, and the cache-used count algorithm is determined as the eviction policy of the cache buffer 240 when the size of the data is greater than the reference value. When the size of the data is less than or equal to the reference value, the LRU algorithm is determined as the eviction policy of the cache buffer 240. Accordingly, an ineffective situation may be prevented, in which valid cache data is evicted from the cache buffer 240 and unnecessary data is stored in the cache buffer 240.

FIGS. 15A to 15F are diagrams illustrating a process of controlling data of the cache buffer 240 through the controller 200 and the operating method thereof in accordance with an embodiment of the present disclosure. Hereinafter, the process will be described with reference to FIGS. 10 and 11 together.

Referring to FIG. 15A, a cache information table 241 includes a LRU priority order and a cache-used count regarding each cache data stored in the cache buffer 240. As shown in FIG. 11, this is for selectively applying the LRU algorithm or the cache-used count algorithm according to the size of read data corresponding to the read request received from the host.

Referring to FIG. 15B, a cache information table 241 may be updated when new read data is stored as cache data C_DATA_10 in the cache buffer 240 under the situation shown in FIG. 15A. At the step S210 shown in FIG. 10, the controller 200 receives a read request for the new read data from the host. The read-requested data is data that is not stored in the cache buffer 240.

Referring to FIGS. 15B to 15E, the read data includes a plurality of data segments. That is, read data corresponding to the read request received from the host includes data substantially identical to the cache data C_DATA_10, C_DATA_11, C_DATA_12, C_DATA_13, C_DATA_14, and C_DATA_15 added to the cache buffer 240 in FIGS. 15B to 15E.

As the determination result of the step S330 shown in FIG. 11, it may be determined that the size (S) of read data corresponding to the read request received from the host is greater than the reference value (R). Accordingly, when the read data corresponding to the corresponding read request is stored in the cache buffer 240, the evicted victim cache data may be determined using the cache-used count algorithm through the step S350 shown in FIG. 11.

Thus, when the cache data C_DATA_10 is stored in the cache buffer 240, victim cache data is determined according to the cache-used count algorithm. Referring to FIG. 15A, cache data having the smallest cache-used count is the cache data C_DATA_06. Therefore, as shown in FIG. 15B, the cache data C_DATA_06 is deleted from the cache buffer 240, and new cache data C_DATA_10 is stored in the cache buffer 240.

The cache data C_DATA_11 next to the cache data C_DATA_10 is data included in read data corresponding to one read request received from the host. Therefore, when the cache data C_DATA_11 is stored in the cache buffer 240, victim cache data to be evicted may be determined according to the cache-used count algorithm.

Referring to FIG. 15B, the cache-used count of the cache data C_DATA_10 is smallest. As shown in FIG. 15C, the cache data C_DATA_10 is deleted from the cache buffer 240, and new cache data C_DATA_11 is stored in the cache buffer 240.

The cache data C_DATA_12 next to the cache data C_DATA_11 is also data included in read data corresponding to one read request received from the host. Therefore, when the cache data C_DATA_12 is stored in the cache buffer 240, victim cache data to be evicted may be determined according to the cache-used count algorithm.

Figure 15D:

Referring to FIG. 15C, the cache-used count of the cache data C_DATA_11 is smallest. Therefore, as shown in FIG. 15D, the cache data C_DATA_11 is deleted from the cache buffer 240, and new cache data C_DATA_12 is stored in the cache buffer 240.

Figure 15E:

In this manner, when the size of read data corresponding to the read request received from the host is greater than the reference value, victim cache data is determined according to the cache-used count algorithm. Therefore, as shown in FIGS. 15A to 15D, when the cache data C_DATA_10, C_DATA_11, and C_DATA_12 corresponding to data segments included in the read data are stored in the cache buffer 240, cache data stored in the cache buffer 240 just before the cache data are stored in the cache buffer 240 is selected as the victim cache data to be evicted from the cache buffer 240, and other cache data C_DATA_01, C_DATA_02, C_DATA_03, C_DATA_04, and C_DATA_05 are maintained in the cache buffer 240. Referring to FIG. 15E, this process is repeated until the last data segment of read data corresponding to the read request received from the host is stored as the cache data C_DATA_15 in the cache buffer 240.

Figure 15F:
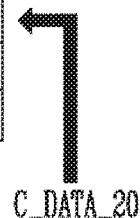

Referring to FIG. 15F, a cache buffer operation is illustrated when the size of read data corresponding to a new read request is less than the reference value. When the controller 200 receives a read request for read data having a size less than the reference value (R) under the situation shown in FIG. 15E, victim cache data of the cache buffer 240 is determined according to the LRU algorithm through the step S370 shown in FIG. 11. In the cache information table 241 shown in FIG. 15E, cache data having the highest LRU priority order is the cache data C_DATA_04. Therefore, when new read data is input as cache data C_DATA_20, the cache data C_DATA_04 is evicted according to the LRU algorithm.

As described above, according to the operating method of the controller 200, an eviction policy of the cache buffer 240 is determined based on the read request received from the host (S230). More specifically, an eviction policy of the cache buffer 240 is determined according to the size of read data corresponding to the read request received from the host. Thus, the cache buffer 240 may be more efficiently used, and accordingly, the read performance of the memory system 1000 may be improved.

Figure 16:
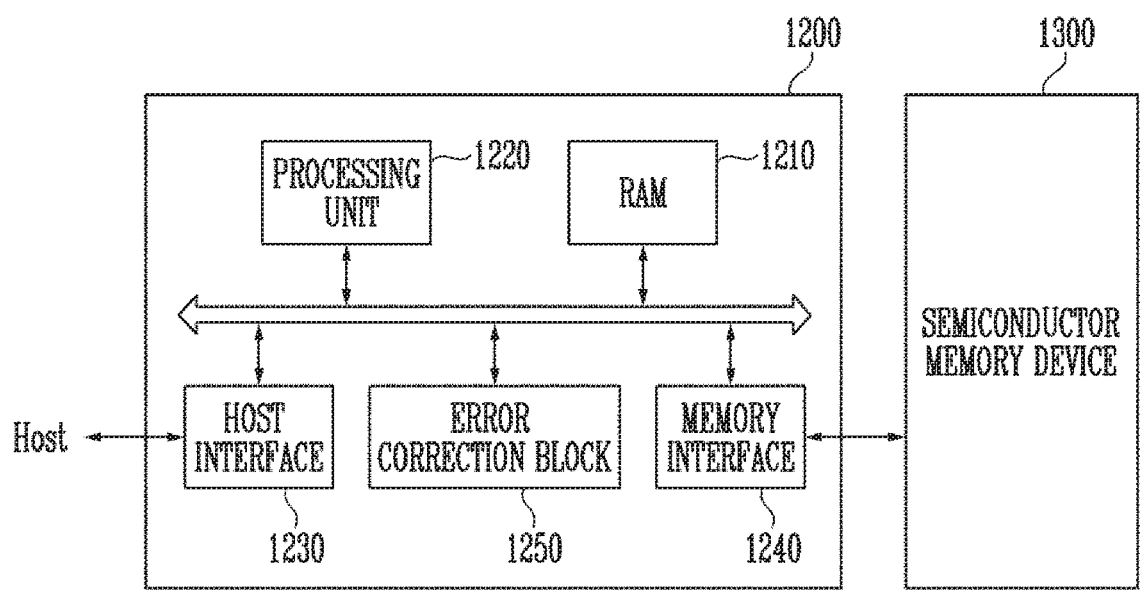
FIG. 16 is a block diagram illustrating a memory system including the semiconductor memory device shown in FIG. 2 and the controller shown in FIG. 7.

FIG. 16 is a block diagram illustrating an example of a memory system 1000.

Referring to FIG. 16, the memory system 1000 includes a controller 1200 and a semiconductor memory device 1300. The semiconductor memory device 1300 corresponds to the semiconductor memory device 100 shown in FIG. 2 and the controller 1200 corresponds to the controller 200 shown in FIG. 7.

The semiconductor memory device 1300 may be configured and operated identically to the semiconductor memory device 100 described with reference to FIG. 2. Hereinafter, overlapping descriptions will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, program, erase, and background operations of the semiconductor memory device 1300. The controller 1200 is configured to provide an interface between the semiconductor memory device 1300 and the host Host. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as any one of a working memory of the processing unit 1220, a cache memory between the semiconductor memory device 1300 and the host Host, and a buffer memory between the semiconductor memory device 1300 and the host Host. The cache buffer 240 shown in FIG. 7 may be implemented as a portion of the RAM 1210 shown in FIG. 16.

The processing unit 1220 controls overall operations of the controller 1200. The processing unit 1220 controls a read, program, erase, and background operations of the semiconductor memory device 1300. The processing unit 1220 drives firmware for controlling the semiconductor memory device 1300. The processing unit 1220 may perform a function of a flash translation layer (FTL). The processing unit 1220 may translate a logical block address (LBA) provided by the host Host through the FTL into a physical block address (PBA). The FTL may translate a received LBA, using a mapping table, into a PBA. Several address mapping methods of the FTL exist according to mapping units. A representative address mapping method includes a page mapping method, a block mapping method, and a hybrid mapping method.

The request analyzer 210, the command generator 220, and the cache controller 230, which are shown in FIG. 7, may be implemented in the form of software or firmware driven by the processing unit 1220 shown in FIG. 16.

The host interface 1230 includes a protocol for exchanging data between the host Host and the controller 1200. In an exemplary embodiment, the controller 1200 is configured to communicate with the host Host through at least one of various interface protocols such as a Universal Serial Bus (USB) protocol, a Multi-Media Card (MMC) protocol, a Peripheral Component Interconnection (PCI) protocol, a PCI-Express (PCI-e or PCIe) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol. The data output unit 250 shown in FIG. 7 may be implemented as a portion of the host interface 1230 shown in FIG. 16.

The memory interface 1240 interfaces with the semiconductor memory device 1300. For example, the memory interface 1240 may include a NAND interface or a NOR interface. The data receiver 260 shown in FIG. 7 may be implemented as a portion of the memory interface 1240 shown in FIG. 16.

The error correction block 1250 is configured to detect and correct an error of data received from the semiconductor memory device 1300 by using an error correction code (ECC). The error correction block 1250 may correct an error of read page data, using an ECC. The error correction block 1250 may correct an error, using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation (BCM), Hamming code, etc.

In a read operation, the error correction block 1250 may correct an error of read page data. When error bits having a number which exceeds an error correctable bit number are included in the read page data, decoding may fail. When error bits having a number which is less than or equal to the error correctable bit number are included in the read page data, the decoding may succeed. The success of the decoding represents that a corresponding read command has passed. The failure of the decoding represents that the corresponding command has failed. When the decoding succeeds, the controller 1200 outputs the page data having the error which has been corrected, to the host Host.

The controller 1200 and the semiconductor memory device 1300 may be integrated into one semiconductor device. In an exemplary embodiment, the controller 1200 and the semiconductor memory device 1300 may be integrated into one semiconductor device, to constitute a memory card. For example, the controller 1200 and the semiconductor memory device 1300 may be integrated into one semiconductor device, to constitute a memory card such as a PC card (Personal Computer Memory Card International Association (PCMCIA)), a Compact Flash (CF) card, a Smart Media Card (e.g., SM or SMC), a memory stick, a Multi-Media Card (e.g., MMC, RS-MMC or MMCmicro), a secure digital (SD) Card (e.g., SD, miniSD, microSD or SDHC), or a Universal Flash Storage (UFS).

The controller 1200 and the semiconductor memory device 1300 may be integrated into one semiconductor device to constitute a semiconductor drive (solid state drive (SSD)). The solid state drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 1300 or the memory system 1000 may be packaged in various forms. For example, the semiconductor memory device 100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 17:
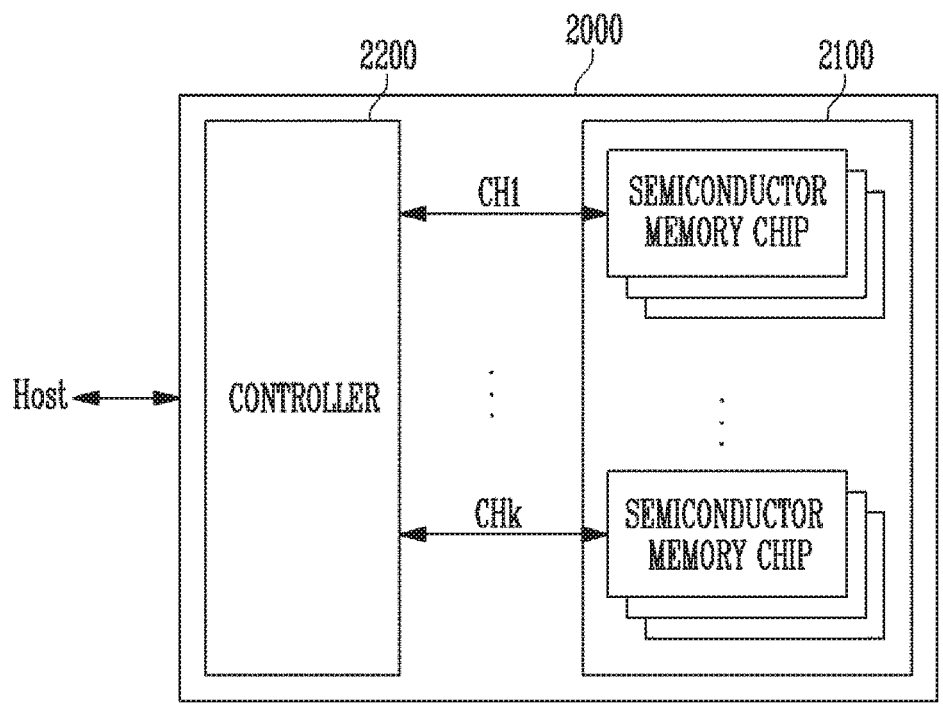
FIG. 17 is a block diagram illustrating an application example of the memory system shown in FIG. 16.

FIG. 17 is a block diagram illustrating a memory system 2000 corresponding to an application example of the memory system 1000 shown in FIG. 16.

Referring to FIG. 17, the memory system 2000 includes a semiconductor memory device 2100 and a controller 2200. The semiconductor memory device 2100 includes a plurality of semiconductor memory chips. The plurality of semiconductor memory chips are divided into a plurality of groups.

FIG. 17 illustrates that the plurality of groups communicate with the controller 2200 through first to kth channels CH1 to CHk. Each semiconductor memory chip may be configured and operated identically to the semiconductor memory device 1300 described with reference to FIG. 16.

Each group is configured to communicate with the controller 2200 through one common channel. The controller 2200 is configured identically to the controller 1200 described with reference to FIG. 16. The controller 2200 is configured to control the plurality of memory chips of the semiconductor memory device 2100 through the plurality of channels CH1 to CHk.

In FIG. 17, a case where a plurality of semiconductor memory chips are coupled to one channel is described. However, it will be understood that the memory system 2000 may be modified such that one semiconductor memory chip is coupled to one channel.

Figure 18:
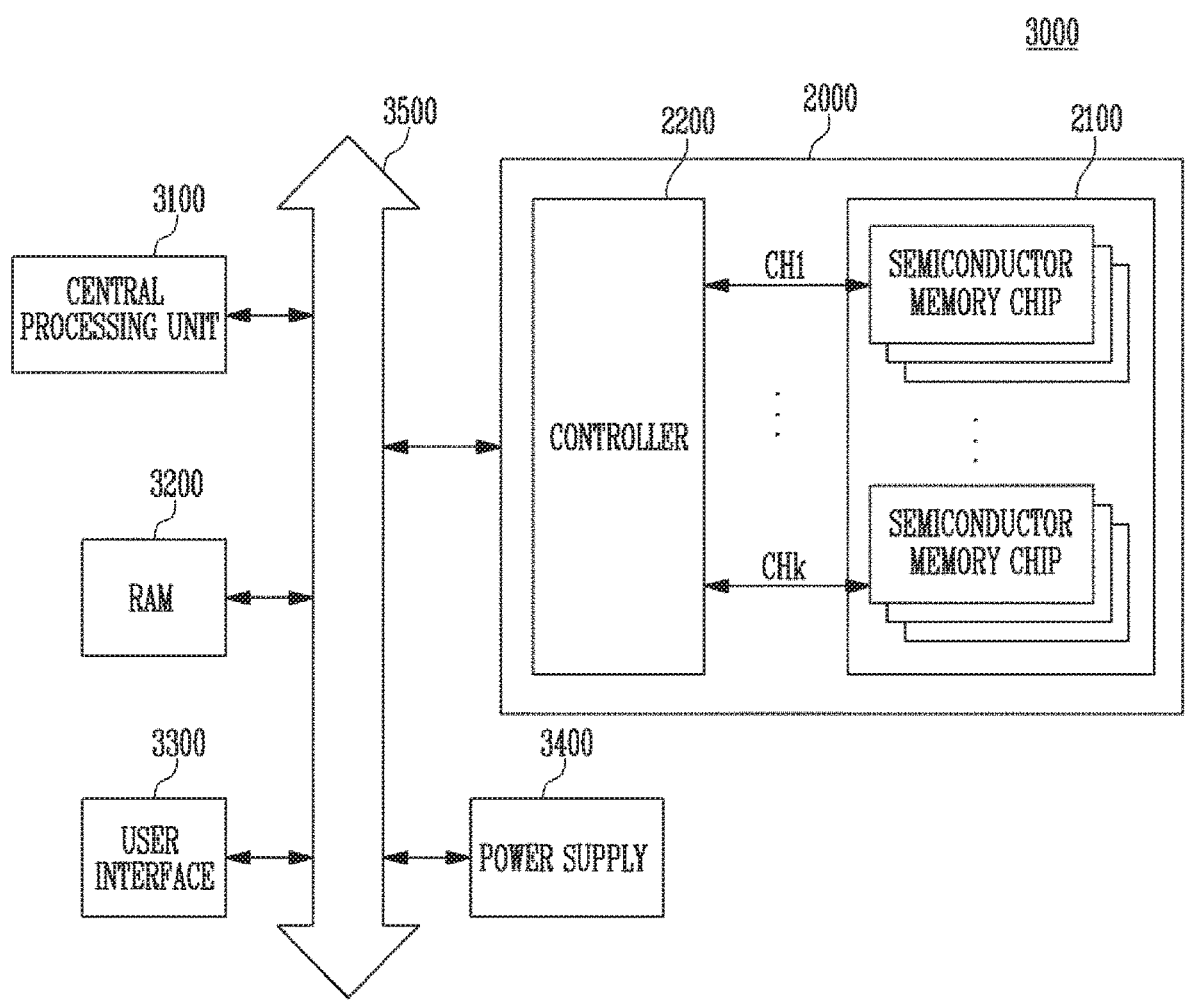
FIG. 18 is a block diagram illustrating a computing system including the memory system described with reference to FIG. 17.

FIG. 18 is a block diagram illustrating a computing system 3000 including the memory system described with reference to FIG. 17.

Referring to FIG. 18, the computing system 3000 includes a central processing unit 3100, a random access memory (RAM) 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

FIG. 18 illustrates that the semiconductor memory device 2100 is coupled to the system bus 3500 through the controller 2200. However, the semiconductor memory device 2100 may be directly coupled to the system bus 3500. The function of the controller 2200 may be performed by the central processing unit 3100 and the RAM 3200.

FIG. 18 illustrates that the memory system 2000 described with reference to FIG. 17 is provided. However, the memory system 2000 may be replaced by the memory system 1000 described with reference to FIG. 16. In an embodiment, the computing system 3000 may be configured to include both of the memory systems 1000 and 2000 described with reference to FIGS. 16 and 17.

In accordance with the present disclosure, there may be provided a controller capable of efficiently using a cache buffer and an operating method thereof.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

It should be understood that many variations and modifications of the basic inventive concept described herein will still fall within the spirit and scope of the present disclosure as defined in the appended claims and their equivalents.

What is claimed is:

1. A controller for controlling an operation of a semiconductor memory device, the controller comprising:
   a cache buffer configured to store multiple cache data;
   a request analyzer configured to generate request information including information on a size of read data to be read corresponding to a read request received from a host; and
   a cache controller configured to determine an eviction policy of the multiple cache data, based on the size of the read data in the request information,
   wherein, in response to a determination that the size of the read data is greater than a predetermined reference value, the cache controller controls the cache buffer to evict cache data that has been least frequently used among the multiple cache data, and
   wherein, in response to a determination that the size of the read data is less than or equal to the predetermined reference value, the cache controller controls the cache buffer to evict cache data that was unused for a longest time among the multiple cache data.

2. The controller of claim 1, wherein the cache buffer stores a cache information table including information on use records of the multiple cache data.

3. The controller of claim 2, wherein the information on the use records of the multiple cache data includes information on an order of a least recently used (LRU) priority determined by a time at which each cache data has been lastly used.

4. The controller of claim 2, wherein the information on the use records of the cache data includes a cache-used count representing a number at which each cache data is used.

5. The controller of claim 1, further comprising:
   a command generator configured to generate a read command corresponding to the read request, when cache data corresponding to the read request is not stored in the cache buffer;
   a data receiver configured to receive read data corresponding to the read command from the semiconductor memory device; and
   a data output unit configured to output the received read data to the host.

6. The controller of claim 5, wherein, when the cache data corresponding to the read request is stored in the cache buffer, the data output unit outputs the cache data stored in the cache buffer to the host.

7. A method for operating a controller for controlling an operation of a semiconductor memory device, the method comprising:
   receiving a read request of data from a host;
   determining an eviction policy of a cache buffer, based on a size of read data corresponding to the received read request; and
   deleting a cache data of multiple cache data stored in the cache buffer, based on the determined eviction policy,
   wherein the determining the eviction policy of a cache buffer includes:
   determining a cache-used count algorithm, which selects data that has been least frequently used among the multiple cache data to be evicted, as the eviction policy of the cache buffer in response to a determination that the size of the read data is greater than a predetermined reference value; or
   determining a least recently used (LRU) algorithm, which selects data that was unused for a longest time among the multiple cache data to be evicted, as the eviction policy of the cache buffer in response to a determination that the size of the read data is less than or equal to the predetermined reference value.

8. The method of claim 7, wherein the determining of the eviction policy of the cache buffer includes:
   checking the size of the read data;
   comparing the size of the read data with the predetermined reference value; and
   determining the eviction policy of the cache buffer, based on the comparison result.

9. The method of claim 7, further comprising deleting cache data having a least used number from the cache buffer, based on the cache-used count algorithm.

10. The method of claim 7, further comprising deleting cache data that unused for a longest time from the cache buffer, based on the LRU algorithm.

11. The method of claim 7, further comprising, when cache data corresponding to the read request exists in the cache buffer, outputting the cache data corresponding to the read request from the cache buffer to the host.

12. The method of claim 7, further comprising: when the cache data corresponding to the read request does not exist in the cache buffer,
   transferring a read command corresponding to the read request to the semiconductor memory device;

receiving read data corresponding to the read command from the semiconductor memory device; and outputting the received read data to the host.

13. The method of claim 12, further comprising storing the read data as new cache data in the cache buffer.

14. A memory system comprising:
a semiconductor memory device including a plurality of memory cells for storing a plurality of data; and
a controller configured to control an operation of the semiconductor memory device, and store, as multiple cache data, some data among the plurality of data,
wherein the controller is configured to:
receive a read request from a host;
determine an eviction policy of the multiple cache data, based on the size of the read data corresponding to the read request; and
evict a cache data among the multiple cache data according to the determined eviction policy, and
wherein, in response to a determination that the size of the read data is greater than a predetermined reference value, the controller determines a cache-used count algorithm, which selects data that has been least frequently used among the multiple cache data to be evicted, as the eviction policy, and
wherein, in response to a determination that the size of the read data is less than or equal to the predetermined reference value, the controller determines a least recently used (LRU) algorithm, which selects data that was unused for a longest time among the multiple cache data to be evicted, as the eviction policy.

* * * * *